(12) United States Patent  
Yang et al.

(10) Patent No.: US 6,674,130 B2
(45) Date of Patent: Jan. 6, 2004

(54) HIGH PERFORMANCE PD SOI TUNNELING-BIASED MOSFET

(75) Inventors: Kuo-Nan Yang, Taipei (TW); Yi-Ling Chan, Junan Jen Misoli (TW); You-Lin Chu, Tai Zhong (TW); Hou-Yu Chen, Kaoshiung (TW); Fu-Liang Yang, Hsin-chu (TW); Chenming Hu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/316,601

(22) Filed: Dec. 11, 2002

(65) Prior Publication Data

US 2003/0122214 A1 Jul. 3, 2003

Related U.S. Application Data

(62) Division of application No. 10/021,702, filed on Dec. 10, 2001, now Pat. No. 6,518,105.

(51) Int. Cl.[7] .................... H01L 23/62; H01L 29/76; H01L 31/113; H01L 27/115; H01L 29/423
(52) U.S. Cl. ............... 257/360; 257/345; 257/E27.103; 257/E29.129; 257/E27.42; 257/471
(58) Field of Search .................. 257/E27.103, E27.112, 257/E29.129, E29.302, 355, 360, 364, 471, 345

(56) References Cited

U.S. PATENT DOCUMENTS

| | | | | |
|---|---|---|---|---|
| 255,171 | A | * 3/1882 | Holcombe et al. | 314/109 |
| 5,960,265 | A | * 9/1999 | Acovic et al. | 438/157 |
| 6,118,155 | A | 9/2000 | Voldman | 257/360 |
| 6,236,088 | B1 | * 5/2001 | Nielson et al. | 257/355 |
| 6,261,878 | B1 | 7/2001 | Doyle et al. | 438/151 |
| 6,268,629 | B1 | 7/2001 | Noguchi | 257/345 |
| 6,306,691 | B1 | 10/2001 | Koh | 438/149 |

* cited by examiner

Primary Examiner—John F. Niebling
Assistant Examiner—Ron Pompey
(74) Attorney, Agent, or Firm—George O. Saile; Stephen B. Ackerman

(57) ABSTRACT

A new type of partially-depleted SOI MOSFET is described in which a tunneling connection between the gate and the base is introduced. This is achieved by using a gate dielectric whose thickness is below its tunneling threshold. The gate pedestal is made somewhat longer than normal and a region near one end is implanted to be P+ (or N+ in a PMOS device). This allows holes (electrons for PMOS) to tunnel from gate to base. Since the hole current is self limiting, applied voltages greater than 0.7 volts may be used without incurring excessive leakage (as is the case with prior art DTMOS devices). A process for manufacturing the device is also described.

16 Claims, 3 Drawing Sheets

HIGH PERFORMANCE PD SOI TUNNELING-BIASED MOSFET

This is a division of patent application Ser. No. 10/021,702, filing date Dec. 10, 2001, High Peformance Pd Soi Tunneling-Biased Mosfet, assigned to the same assignee as the present invention now U.S. Pat. No. 6,518,105.

FIELD OF THE INVENTION

The invention relates to the general field of MOSFETs with particular reference to biasing such devices through tunneling.

BACKGROUND OF THE INVENTION

Mobile and portable electronics have advanced rapidly and there is an increasing demand for high performance and low power digital circuits. The main technology approach for reducing power has been power supply scaling. Power supply scaling needs to be accompanied by threshold voltage reduction in order to preserve low $V_t$ device performance. Unfortunately, low $V_t$ raises sub-threshold leakage.

One solution known to the prior art has been to tie the gate to the substrate so as to operate the device as a dynamic threshold voltage MOSFET (DTMOS). This is illustrated as a plan view in FIG. 1A and schematic diagram FIG. 1B. Seen there is gate pedestal 11 flanked by source and drain 13 and 14 respectively. P+ connector 12 makes a hard connection between the gate 11 and the base 15. In that configuration, the gate input voltage forward biases the substrate/source junction and causes $V_{TH}$ to decrease. But the gate voltage of a DTMOS has to be limited to approximately one diode voltage (−0.7 V at room temperature) to avoid significant junction leakage.

The present invention discloses a solution to this problem which allows an MOS device to operate under power supply voltages larger than 0.7 V.

A routine search of the prior art was performed with the following references of interest being found:

In U.S. Pat. No. 6,261,878 B1, Doyle et al. show a DTMOS process while U.S. Pat. No. 6,118,155 (Voldman) shows another DTMOS process. U.S. Pat. No. 6,268,629 (Noguchi) shows a partially depleted MOS SOI with a tunnel leakage current. U.S. Pat. No. 6,306,691 (Koh) show a DTMOS SOI process.

SUMMARY OF THE INVENTION

It has been an object of at least one embodiment of the present invention to provide an FET device suitable for operation at very low voltage and power.

Another object of at least one embodiment of the present invention has been that said device not be limited to a maximum applied voltage of 0.7 V at room temperature to avoid significant junction leakage.

Still another object of at least one embodiment of the present invention has been to provide a process for manufacturing said device.

These objects have been achieved by eliminating the hard connection between gate and base that is featured in dynamic threshold voltage devices (DTMOS). In its place the present invention introduces a tunneling connection between the gate and the base. This is achieved by using a gate dielectric whose thickness is below its tunneling threshold. The gate pedestal is made somewhat longer than normal and a region near one end is implanted to be P+ in an NMOS device (or N+ in a PMOS device). This allows holes (electrons for PMOS) to tunnel from gate to base. Since the hole current is self limiting, applied voltages greater than 0.7 volts may be used without incurring excessive leakage. A process for manufacturing the device is also described.

BRIEF DESCRIPTION OF THE DRAWINGS

FIG. 1A is a plan view of a DTMOSFET (prior art) showing a hard connection from the gate to the base.

FIG. 1B is the schematic circuit equivalent to FIG. 1A.

DESCRIPTION OF THE PREFERRED EMBODIMENTS

Overview

The transistors are fabricated using a partially-depleted 0.1 micron CMOS/SOI technology. The substrates are 8" SIMOX wafers with a buried oxide thickness of 1500 Å. Partially depleted transistors are processed on a 1900 Å thick silicon film. STI (shallow trench isolation) is used for electrical isolation of the transistors. A polysilicon gate is deposited after thermal growth of gate oxide. One of the main novel features of the invention is the extension of the thin gate oxide layer and p+ polysilicon regions to provide hole tunneling in order to increase the body potential in the on state.

Details

We will disclose the present invention through a description of a process for manufacturing it. In the course of so doing, the structure of the present invention will also become apparent.

Figure 2A:
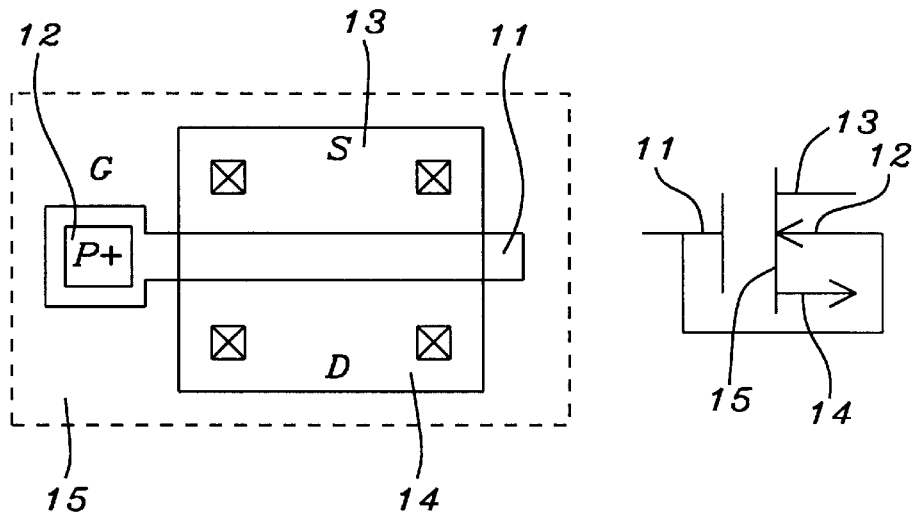
FIG. 2A is a plan view of a TBMOSFET (present invention) showing a tunneling connection from the gate to the base.
Figure 2B:
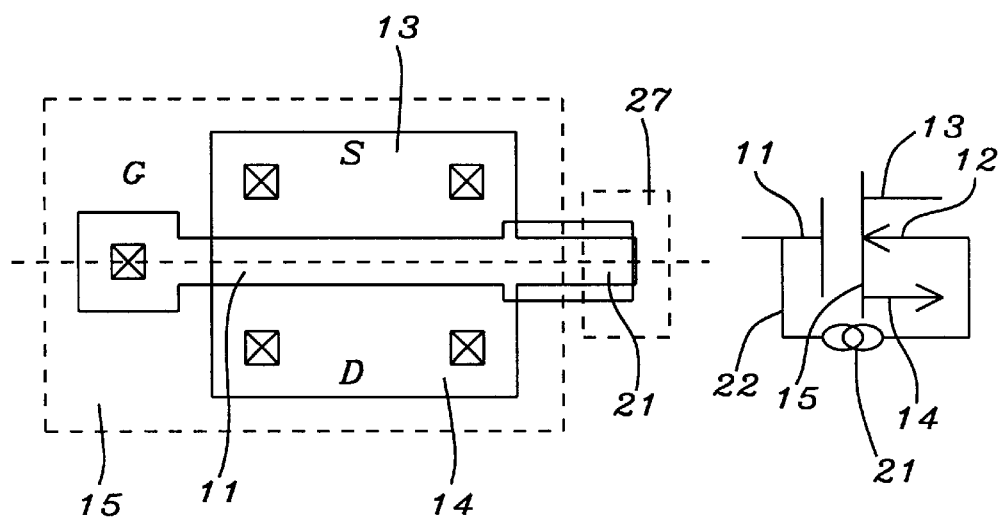
FIG. 2B is the schematic circuit equivalent to FIG. 2A.
Figure 3:
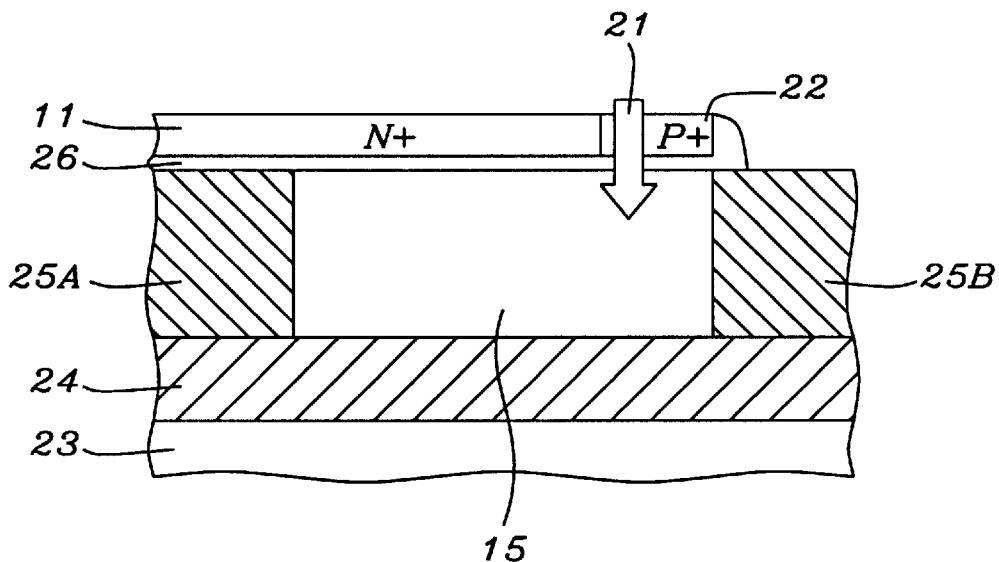
FIG. 3 is an approximate cross-section of FIG. 2A showing where hole tunneling between gate and base can occur.
Figure 4:
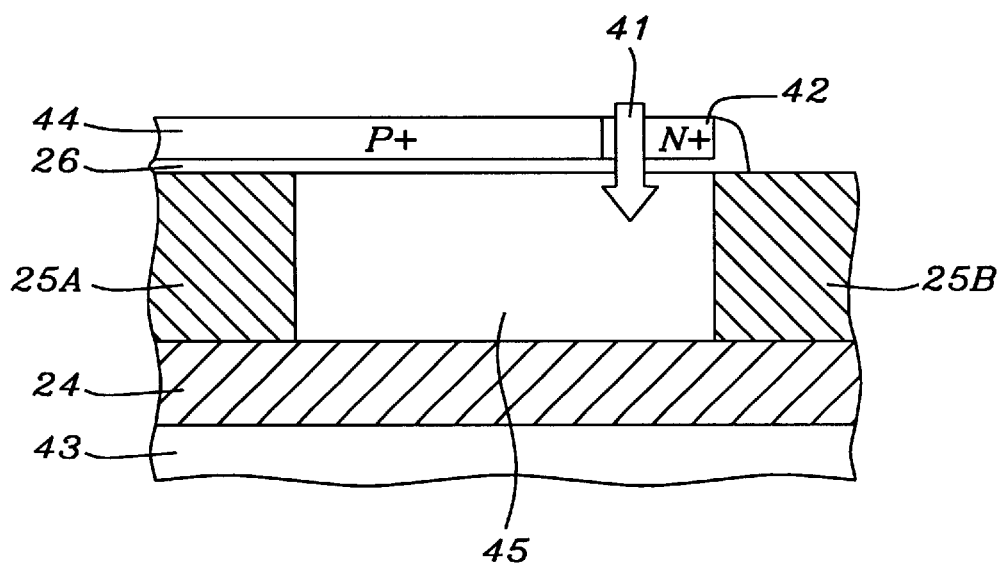
FIG. 4 is the equivalent of FIG. 3 for a PMOS device, showing where electron tunneling between gate and base can occur.

Referring now to FIGS. 2A, 2B, and 3, the process of the present invention begins with the provision of silicon body or wafer 23 (FIG. 3) having a first isolation area in the form of buried oxide layer 24 located between about 1,500 and 1,600 Angstroms below top surface 23A of the silicon body. For an NMOS device the silicon wafer would be P-type (FIG. 3), while for a PMOS device it would be N-type (43 in FIG. 4). We will, from here, focus our description on NMOS but it will be understood by those skilled in the art that it can be applied equally well to PMOS devices if the appropriate reversals of conductivity type are made.

A second isolation area in the form of oxide filled trenches, such as 25A and 25B, that extend downwards from top surface 23A as far as buried layer 24 is formed. These trenches are disposed so as to fully enclose a volume of silicon (P-type in FIG. 3 and N-type in FIG. 4), resulting in the formation of P-well 15 in FIG. 3 (N-well 45 in FIG. 4).

Next, dielectric layer 26 is formed on top surface 23A. Our preferred dielectric layer has been thermally grown silicon oxide but the invention will still work if any other dielectric material that is suitable for use as a gate dielectric (silicon nitride for example) is substituted. A key requirement is that the thickness of 26 must be less than the maximum thickness at which tunneling can still be observed (the tunneling threshold of the dielectric layer). Typically, the thickness of the dielectric layer is between about 5 and 100 Angstroms.

This is followed by the deposition of layer 11 (44 in FIG. 4), usually polysilicon, over dielectric layer 26. This polysilicon layer is then patterned to form the gate pedestal shown as 11 in plan view 2A and circuit schematic 2B. The polysilicon gate has a thickness between about 1,300 and 1,500 Angstroms and has a width between about 0.05 and 0.1 microns. Gate 11 extends from a position above STI trench 25A, across the well, to abut STI trench 25B, giving it a length of between about 0.5 and 1 microns. Gate 11 is then used as a hard mask during the removal of all of dielectric layer 26 that is not directly beneath it.

Using a suitable mask, donor ions are implanted in a region that overlaps the gate pedestal 11 on both sides, as seen in FIG. 2A, so as to form source and drain regions (13 and 14 respectively in FIG. 2A) on opposite sides of the gate pedestal. These donor ions are implanted to a concentration between about $10^{19}$ and $10^{20}$ ions per cm$^3$. For the PMOS device, acceptor ions would be implanted to a concentration between about $10^{19}$ and $10^{20}$ ions per cm$^3$. Additional process steps could be introduced at this stage to produce variations on this general approach (e.g. a lightly doped drain) but these are not germane to the invention.

For a conventional device of the prior art, we would now be at the end of the process. However, a key step is now added to the conventional process. This is the implantation of acceptor ions (through a mask) in region 27 (FIG. 2A) that overlaps end 22 of the gate pedestal (42 in FIG. 4) by between about 0.01 and 1 microns. These acceptor ions are implanted to a concentration between about $10^{19}$ and $10^{20}$ ions per cm$^3$. For the PMOS device, donor ions would be implanted to a concentration between about $10^{19}$ and $10^{20}$ ions per cm$^3$. The presence of the P+ region at the end of gate 11 causes a tunneling connection 21 for holes to be formed. Similarly, the presence of N+ region 42 at the end of gate 44 (FIG. 4) causes a tunneling connection 41 for electrons to be formed.

Figure 5:
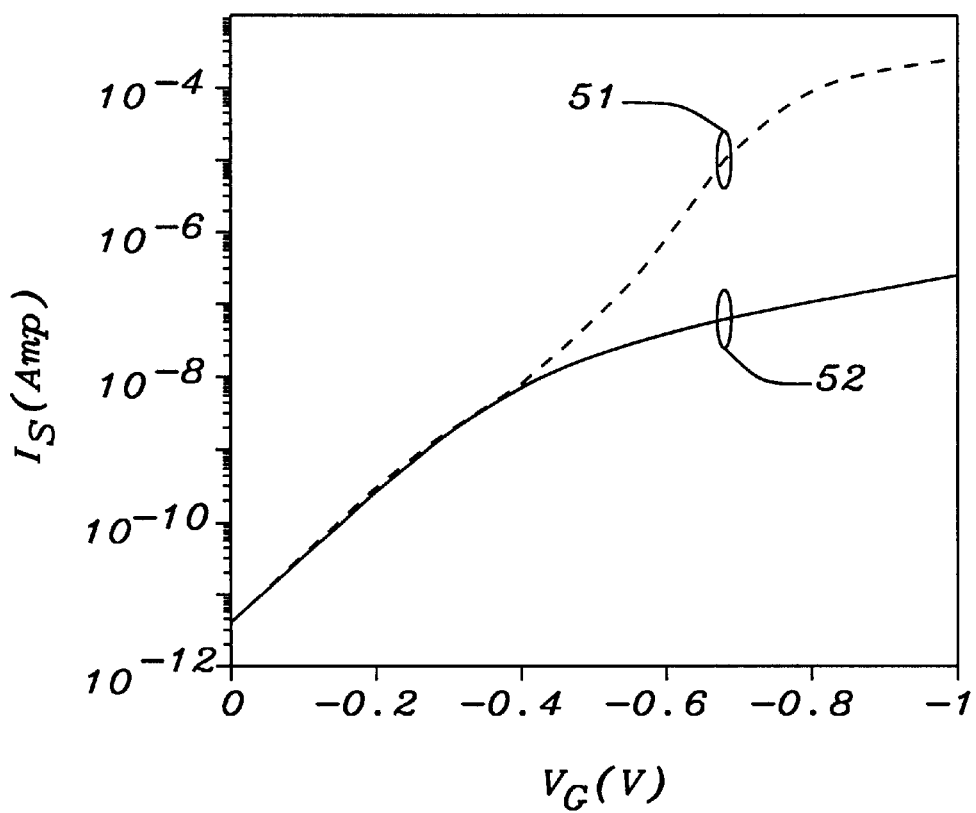
FIG. 5 compares source-drain current vs. gate voltage for DTMOS and TBMOS devices.

A comparison between DTMOS (prior art) and TBMOS (present invention) is presented in FIG. 5 which plots source-to-drain current as a function of gate voltage. Curve 51 is for a conventional device (DTMOS) while curve 52 is for a device made as described above (TBMOS). It is obvious that the leakage of DTMOS is significantly larger than that of TBMOS—about three orders of magnitude. This shows that TBMOS can operate at a power supply voltage ($V_{dd}$) that is greater than 0.7 V.

What is claimed is:

1. A tunneling-biased NMOSFET structure comprising:
   a P-type semiconductor body having a top surface and a first isolation area located a distance below said top surface;
   a second isolation area that extends downwards from said top surface as far as said first isolation area, said second isolation area being disposed so as to fully enclose a volume of said P-type semiconductor, thereby forming a P-well;
   a gate pedestal, having two opposing long sides that extend from a first end across said P-well to a second end;
   a dielectric layer between said gate pedestal and said upper surface;
   an N-type region within said P-well that abuts both of said long sides, said N-type region constituting source and drain areas disposed on opposing sides of said gate pedestal; and
   a P+ region with that abuts said polysilicon gate enclosing at least part thereof, thereby providing a tunneling connection between said P-well and said polysilicon gate.

2. The structure described in claim 1 wherein said first isolation area is a buried oxide layer.

3. The structure described in claim 1 wherein said second isolation area further comprises one or more oxide filled trenches.

4. The structure described in claim 1 wherein said dielectric layer is selected from the group consisting of all possible gate dielectric materials.

5. The structure described in claim 1 wherein said dielectric layer has a thickness between about 5 and 100 Angstroms.

6. The structure described in claim 1 wherein said gate pedestal has a thickness between about 1,300 and 1,500 Angstroms.

7. The structure described in claim 1 wherein said gate pedestal has a width between about 0.05 and 0.1 microns.

8. The structure described in claim 1 wherein said gate pedestal has a length between about 0.5 and 1 microns.

9. The structure described in claim 1 wherein said P+ region has a concentration of acceptor ions between about $10^{19}$ and $10^{20}$ ions per cm$^3$.

10. The structure described in claim 1 wherein said distance below said top surface at which is located said buried layer is between about 1,500 and 1,600 Angstroms.

11. A tunneling-biased PMOSFET structure comprising:
    an N-type silicon body having a top surface and a buried oxide layer located a distance below said top surface;
    oxide filled trenches that extend downwards from said top surface as far as said buried layer, said trenches being disposed so as to fully enclose a volume of N-type silicon, thereby forming an N-well;
    a polysilicon gate pedestal, having two opposing long sides that extend from a first end over a first oxide filled trench across said N-well to a second end abutting a second oxide filled trench;
    between said gate pedestal and said upper surface, with no intervening layers, a dielectric layer having a thickness that is less than the tunneling threshold of said dielectric layer;
    a P-type region within said N-well that abuts both of said long sides and that does not overlap either of said ends, said P-type region constituting source and drain areas disposed on opposing sides of said gate pedestal; and
    an N+ region within said polysilicon gate, extending inwards from one of said ends, said N+ region constituting a tunneling connection between said N-well and said polysilicon gate.

12. The structure described in claim 11 wherein said dielectric layer is selected from the group consisting of all possible gate dielectric materials.

13. The structure described in claim 11 wherein said dielectric layer has a thickness between about 5 and 100 Angstroms.

14. The structure described in claim 11 wherein said polysilicon gate has a thickness between about 1,300 and 1,500 Angstroms.

15. The structure described in claim 11 wherein said polysilicon gate has a width between about 0.05 and 0.1 microns.

16. The structure described in claim 11 wherein said N+ region has a concentration of donor ions between about $10^{19}$ and $10^{20}$ ions per cm$^3$.

* * * * *